(12) United States Patent
Carroll et al.

(10) Patent No.: US 8,994,152 B2
(45) Date of Patent: Mar. 31, 2015

(54) METAL SHIELD FOR INTEGRATED CIRCUITS

(75) Inventors: Roger Carroll, Rosemount, MN (US); Greg Nelson, Fridley, MN (US)

(73) Assignee: Polar Semiconductor, LLC, Bloomington, MN (US)

( * ) Notice: Subject to any disclaimer, the term of this patent is extended or adjusted under 35 U.S.C. 154(b) by 0 days.

(21) Appl. No.: 13/415,407

(22) Filed: Mar. 8, 2012

(65) Prior Publication Data

US 2013/0234303 A1   Sep. 12, 2013

(51) Int. Cl.
*H01L 23/552* (2006.01)
*H01L 23/522* (2006.01)

(52) U.S. Cl.
CPC .......... *H01L 23/552* (2013.01); *H01L 23/5225* (2013.01); *H01L 2924/0002* (2013.01)
USPC .......................................................... 257/659

(58) Field of Classification Search
CPC ........................... H01L 23/522; H01L 23/5225
USPC ........................... 438/598, 612, 618; 257/659
See application file for complete search history.

(56) References Cited

U.S. PATENT DOCUMENTS

| 7,335,966 | B2 | 2/2008 | Ihme et al. | |
|---|---|---|---|---|
| 2006/0163743 | A1* | 7/2006 | Kuwabara et al. | 257/773 |
| 2006/0258147 | A1* | 11/2006 | Colburn et al. | 438/622 |
| 2008/0012097 | A1* | 1/2008 | Takahashi et al. | 257/659 |
| 2011/0049724 | A1* | 3/2011 | Anderson et al. | 257/773 |

\* cited by examiner

*Primary Examiner* — Shaun Campbell
(74) *Attorney, Agent, or Firm* — Kinney & Lange, P.A.

(57) ABSTRACT

A metal shield structure is provided for an integrated circuit (IC) having at least a first metal contact coupled to a fixed potential and a second metal contact. A first passivation layer is located between the first and second metal contacts and on a first portion of the first metal contact and a first portion of the second metal contact, leaving a second portion of the first metal contact and a second portion of the second metal contact uncovered by the first passivation layer. A metal shield layer is provided on the second portion of the first metal contact and on the first passivation layer, and a second passivation layer is formed on the metal shield layer.

8 Claims, 4 Drawing Sheets

METAL SHIELD FOR INTEGRATED CIRCUITS

BACKGROUND

The present invention relates to an improved metal shield for integrated circuits.

The operation of integrated circuits (ICs) can be disrupted by outside influences such as electromagnetic interference (EMI). A metal shield layer is provided to protect circuit functions from such interference. In many typical designs, a relatively thick aluminum layer is used as the shield layer, and two masks are required to pattern the layer. An improved metal shield design is desirable.

SUMMARY

The present invention, in one aspect, is a metal shield structure provided for an integrated circuit (IC) having at least a first metal contact coupled to a fixed potential and a second metal contact. A first passivation layer is located between the first and second metal contacts and on a first portion of the first metal contact and a first portion of the second metal contact, leaving a second portion of the first metal contact and a second portion of the second metal contact uncovered by the first passivation layer. A metal shield layer is provided on the second portion of the first metal contact and on the first passivation layer, and a second passivation layer is formed on the metal shield layer. Another aspect of the present invention is a method of forming such a metal shield structure.

DETAILED DESCRIPTION

FIGS. 1-7 are diagrams illustrating the fabrication of an improved metal shield structure according to an embodiment of the present invention. The improved metal shield structure is self-aligned, which eliminates misalignment errors, and requires only a single masking layer, as described in detail below.

Figure 1:
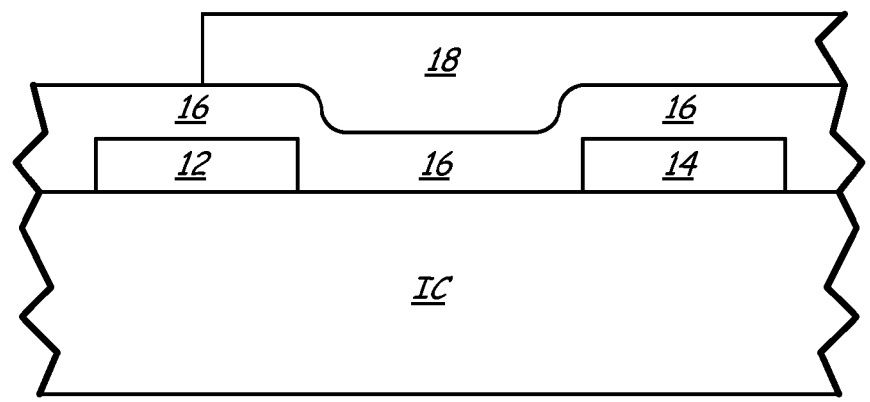
FIGS. 1-7 are diagrams illustrating the fabrication of an improved metal shield structure according to an embodiment of the present invention

FIG. 1 is a diagram illustrating an initial step in a process of forming an electromagnetic shield for an integrated circuit (IC) according to an embodiment of the present invention. As shown in FIG. 1, metal top layers 12 and 14 of an IC are covered by passivation layer 16, which is formed of silicon dioxide ($SiO_2$) or tetraethoxysilane (TEOS) in exemplary embodiments. Masking photoresist layer 18 is then formed over a portion of passivation layer 16, to define a pattern for a via of the later-formed metal shield layer to contact metal top layer 12. Next, an etching step is performed to remove the exposed portion of passivation layer 16, exposing a portion of metal top layer 12. Masking photoresist layer 18 is then stripped away, resulting in the configuration shown in FIG. 2, which is a diagram illustrating an intermediate step in the process of forming an electromagnetic shield for an IC according to an embodiment of the present invention.

Figure 3:
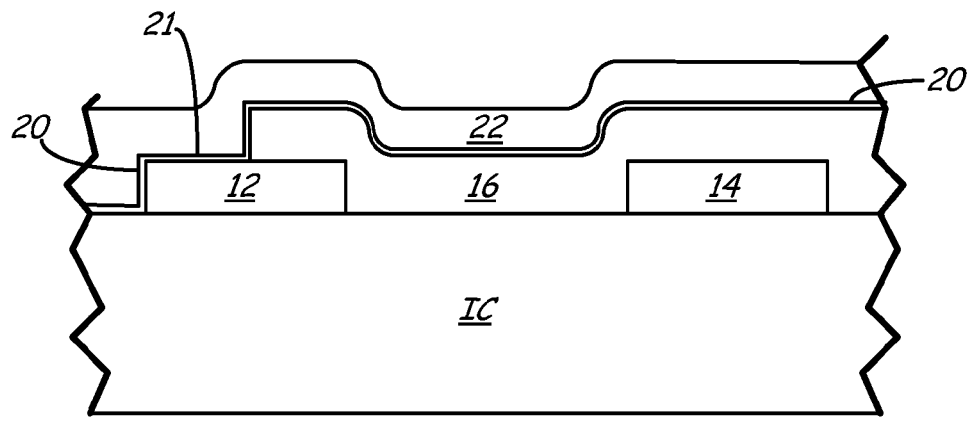

FIG. 3 is a diagram illustrating a further intermediate step in the process of forming an electromagnetic shield for an IC according to an embodiment of the present invention. As shown in FIG. 3, metal shield layer 20 is formed over the exposed portion of metal top layer 12 and the remaining portion of passivation layer 16. The portion of metal shield layer 20 that is formed on metal top layer 12 is referred to as via 21, which electrically connects metal shield layer 20 to metal top layer 12, which is a grounded bond pad in an exemplary embodiment. In an exemplary embodiment, metal shield layer 20 is formed of titanium nitride (TiN), although other conductive materials may be used. Metal shield layer 20 is formed with a thickness that is less than the thickness of a typical aluminum shield layer in existing processes, and may have a thickness of about 400 Angstroms (Å) in an exemplary embodiment. In some embodiments, metal shield layer 20 is semi-transparent, which allows the patterns underneath to be visually inspected and allows visible labels such as part numbers or die orientations to be used effectively. A second passivation layer 22 is then formed over metal shield layer 20. Passivation layer 22 may be formed of silicon nitride ($Si_3N_4$) in an exemplary embodiment.

Figure 4:
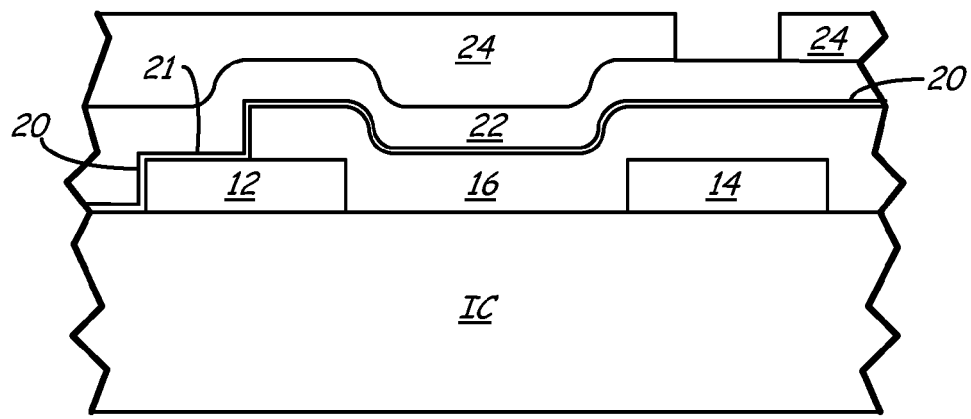
Figure 5:
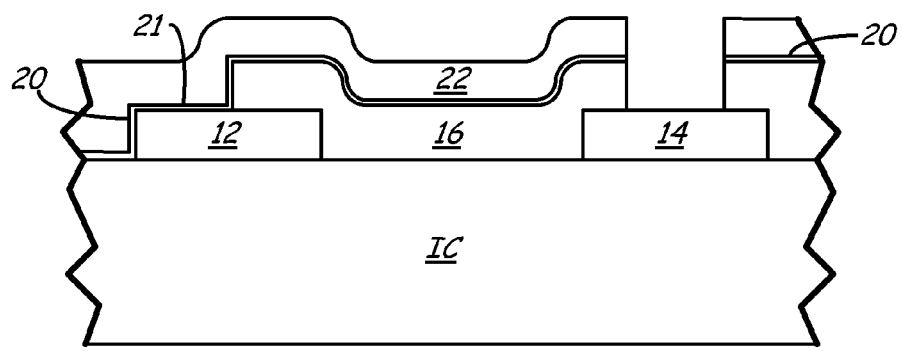

FIG. 4 is a diagram illustrating a further intermediate step in the process of forming an electromagnetic shield for an IC according to an embodiment of the present invention. As shown in FIG. 4, photoresist layer 24 is next formed over portions of passivation layer 22, to define a pattern for an opening to metal top layer 14. An etching step is then performed to remove the exposed portions of passivation layer 22, metal shield layer 20 and passivation layer 16. Photoresist layer 24 is then stripped away, resulting in the configuration shown in FIG. 5, which is a diagram illustrating a further intermediate step in the process of forming an electromagnetic shield for an IC according to an embodiment of the present invention.

Figure 6:
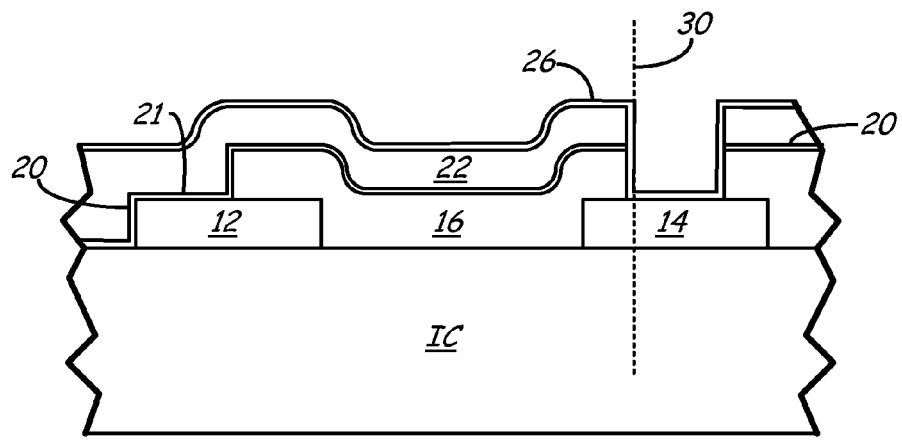
Figure 7:
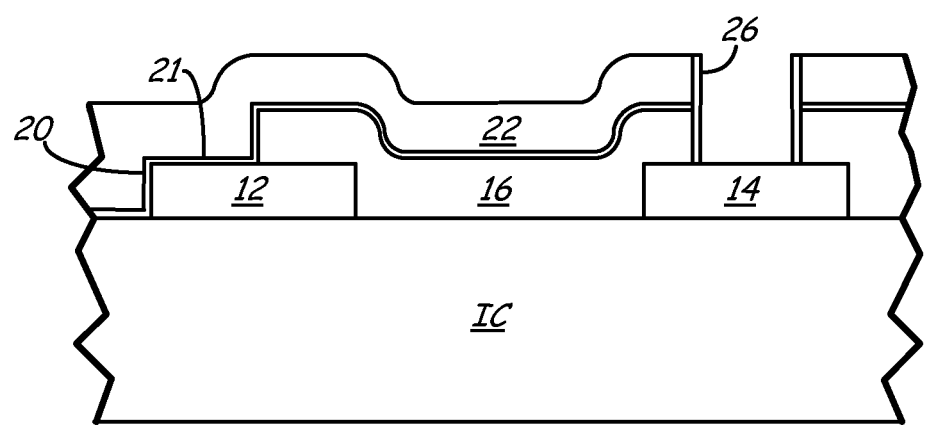

FIG. 6 is a diagram illustrating a further intermediate step in the process of forming an electromagnetic shield for an IC according to an embodiment of the present invention. As shown in FIG. 6, thin spacer layer 26, formed of silicon nitride ($Si_3N_4$) or a similar material, is then deposited over passivation layer 22 and metal top layer 14. A vertical anisotropic etch is then performed to remove spacer layer 26 on top of a portion of metal top layer 14, without removing spacer layer 26 over the edge of passivation layer 22, metal shield layer 20 and the passivation layer 16, resulting in the configuration shown in FIG. 7, which is a diagram illustrating a further intermediate step in the process of forming an electromagnetic shield for an IC according to an embodiment of the present invention. As shown in FIG. 7, spacer layer 26 forms a seal adjacent to the right-most end of metal shield layer 20, to reduce the possibility of shorting or breakdown between metal shield layer 20 and bond wires (not shown) connecting to metal top layer 14. In an alternative embodiment, an additional mask could be used to recess metal shield layer 20 away from a contact to metal top layer 14, to avoid shorting in that way. In this embodiment (or in others as well), metal shield layer 20 could be formed on top of passivation layer 22. Spacer layer 26 also helps to seal the chip by covering the oxide side wall in the pads and streets.

In an exemplary application, metal shield layer 20 serves to deflect or absorb electromagnetic energy that could potentially interfere with the integrated circuit below (the top layer of which is shown as metal top layers 12 and 14). Prior designs of metal shields for applications of this kind have used a thick layer of aluminum for the shield, connected to ground using a via masking layer and patterned around non-grounded bond pads using a metal masking layer. These two masking layers defined the connection to and the extent of the metal shield. In order to aid the patterning and etching of the shield layer, the dielectric layers underneath were often planarized, which led to non-uniform dielectric thickness across the die.

Figure 2:
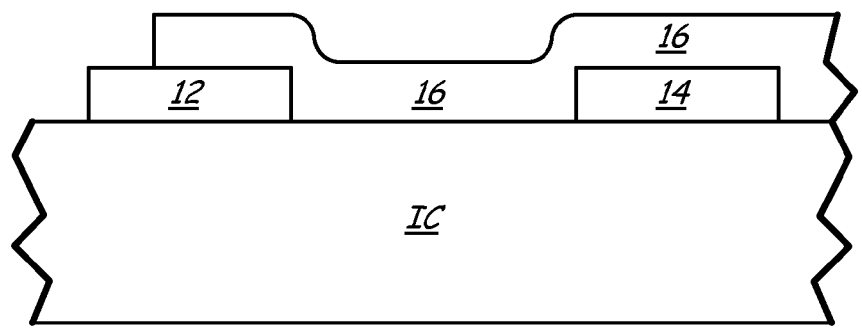

The formation of metal shield layer 20 described above, in contrast to the process used in prior designs, requires only a single masking step in the formation of the shield. Specifically, a masking step is performed to define a pattern for via 21 as shown in FIGS. 1 and 2 and described above. However, while prior designed required an additional masking step to define the extent of metal shield 20, the process of the present invention defines the extent of the metal shield with the process of opening a contact area for contacting metal top layer 14. This provides self-alignment of metal shield layer 20 with metal top layer 14, which allows metal shield layer 20 to be configured to partially overlap metal top layer 14 so that improved shielding is provided, and avoids alignment errors between metal shield layer 20 and metal top layer 14. Metal shield layer 20, in many embodiments, is sufficiently thin that planarization is not necessary. The breakdown voltage should be easily determinable and well controlled because first passivation layer 16 is formed with a uniform thickness. In addition, in some embodiments, metal shield layer 20 is so thin as to be semi-transparent, allowing patterns underneath to be seen, which allows for visual inspection and/or the use of visible labels such as part numbers or die orientation.

Metal shield layer 20 is sandwiched between passivation layers 16 and 22. The inclusion of metal shield layer 20 in this passivation stack may, in some embodiments, improve the passivation integrity of the device, since metal shield layer provides a barrier to crack propagation and provides a film that is impervious to moisture.

The configurations described above provide an improved metal shield design that is self-aligned, which eliminates misalignment errors, and requires only a single masking layer. While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A shield structure for an integrated circuit (IC) having at least a first metal contact coupled to a fixed potential and a second metal contact, the shield structure comprising:
   a first passivation layer between the first and second metal contacts and on and in contact with a first portion of the first metal contact and a first portion of the second metal contact, leaving a second portion of the first metal contact and a second portion of the second metal contact uncovered by the first passivation layer;
   a metal shield layer on and in contact with the second portion of the first metal contact and on and in contact with the first passivation layer where the first passivation layer is on and in contact with the first portion of the first metal contact and is on and in contact with the first portion of the second metal contact;
   a second passivation layer on and in contact with the metal shield layer; and
   a spacer layer covering a vertical edge of the second passivation layer, the metal shield layer and the first passivation layer at a boundary between the first portion and the second portion of the second metal contact to seal the edge of the metal shield layer.

2. The shield structure of claim 1, wherein the spacer layer is formed of silicon nitride ($Si_3N_4$).

3. The shield structure of claim 1, wherein the metal shield layer is formed of titanium nitride (TiN).

4. The shield structure of claim 1, wherein the metal shield layer has a thickness of no more than 400 Angstroms (Å).

5. The shield structure of claim 1, wherein the metal shield layer is semi-transparent.

6. The shield structure of claim 1, wherein the first passivation layer is formed of silicon dioxide ($SiO_2$) or tetraethoxysilane (TEOS).

7. The shield structure of claim 1, wherein the second passivation layer is formed of silicon nitride ($Si_3N_4$).

8. The shield structure of claim 1, wherein the spacer layer is configured to define a region that allows contact with the second portion of the second metal contact.

* * * * *